Figure 2:
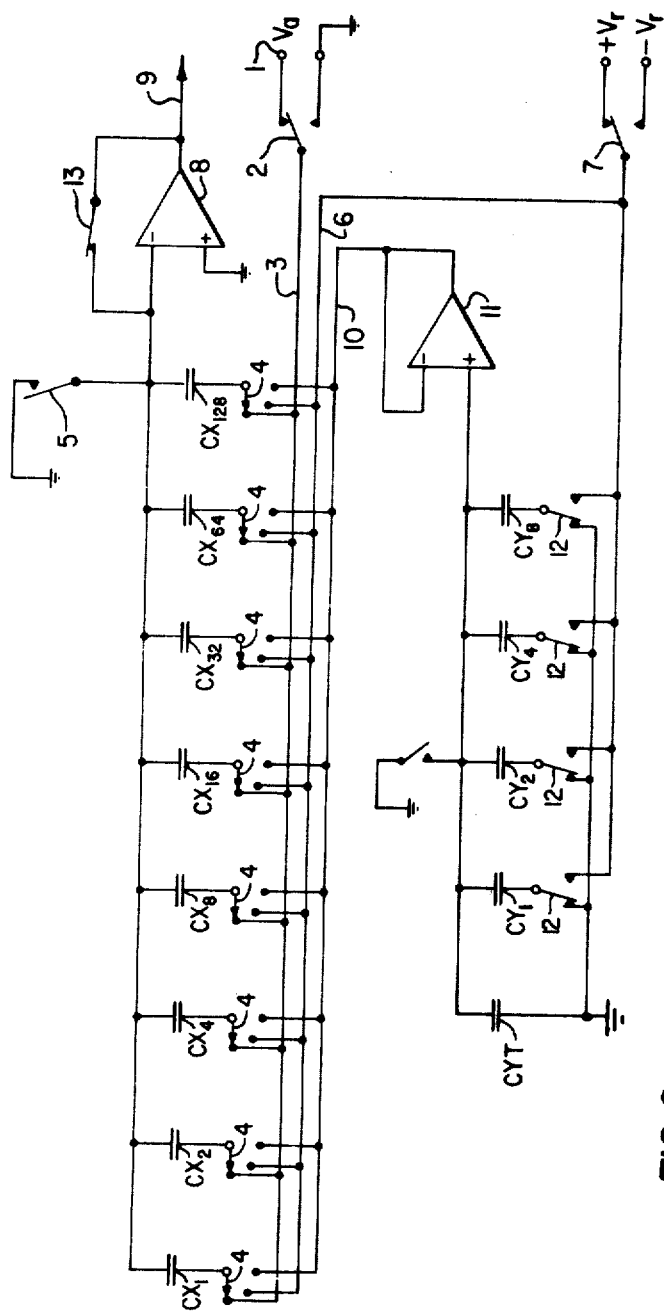

United States Patent [19]

Worsman

[11] 4,380,756

[45] Apr. 19, 1983

[54] CHARGE REDISTRIBUTION CIRCUIT HAVING REDUCED AREA

[75] Inventor: Adrian D. Worsman, Swindon, England

[73] Assignee: Mitel Corporation, Kanata, Canada

[21] Appl. No.: 219,110

[22] Filed: Dec. 22, 1980

[30] Foreign Application Priority Data

Aug. 27, 1980 [CA] Canada .................................. 359106

[51] Int. Cl.³ ............................................ H03K 13/02
[52] U.S. Cl. ........................ 340/347 AD; 340/347 C; 340/347 M
[58] Field of Search ..... 340/347 M, 347 AD, 347 NT

[56] References Cited

U.S. PATENT DOCUMENTS 4,195,282  3/1980  Cameron ...................... 340/347 AD

OTHER PUBLICATIONS

Mostek Corporation, Data Sheet for MK5150 Companding Codec, 5 pages, Cited by applicant.

Primary Examiner—T. J. Sloyan
Attorney, Agent, or Firm—Alan H. Levine

[57] ABSTRACT

A codec using charge redistribution techniques between two groups of banks of weighted capacitors, which requires substantially reduced chip area as compared to previous codecs of this type. A switching scheme by which the capacitors are switched between themselves to various leads allows the elimination of the previously required largest capacitor of one bank and its replacement by a capacitor of one eighth its value and size (as well as several very small capacitors) in the other bank. The switching scheme also allows the use of only one reference voltage level, whereas in the past two were required.

9 Claims, 7 Drawing Figures

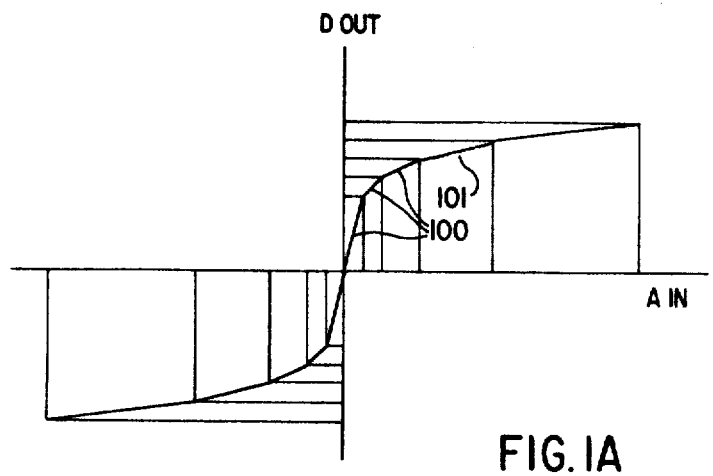
FIG. IA
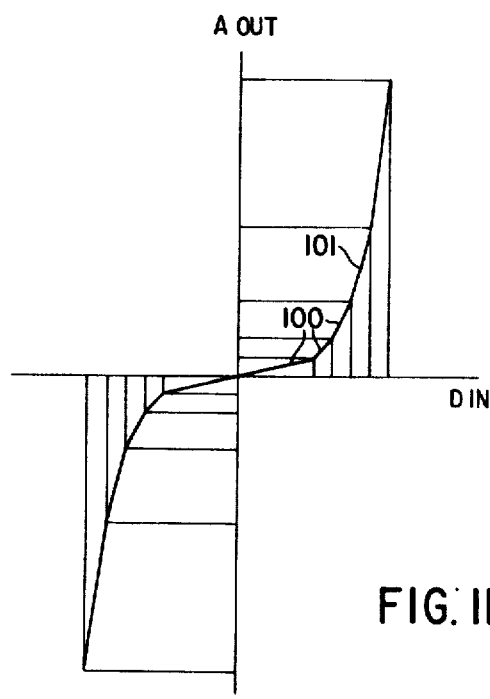
FIG. IB

CHARGE REDISTRIBUTION CIRCUIT HAVING REDUCED AREA

This invention relates to the field of communications and particularly to a codec, a combined analog to digital and digital to analog converter which conforms to the u255 law.

Analog to digital and digital to analog converters are generally utilized where analog and digital transmission channels interface. Combined coder-decoders are generally referred to as codecs; the present invention is directed to an improved form of codec.

The transfer characteristics of a codec have been standardized into approximations of exponential curves. Input signals are compressed and output signals are expanded according to the curves at the respective ends of the digital channel. According to one standard, the approximation of ideal exponential transfer curves is obtained with 8 positive and 8 negative binary weighted segments, each segment being divided into 16 steps. The steps have a relationship such that the length of a segment is double that of a previous segment, with the exception that the first step of the first segment is ½ the size of the next step to facilitate creation of a smooth transition through the transfer characteristic zero point. The last step in each of the decoder segments is 1.5 times longer than the previous ones. Because this arrangement provides 255 decision levels, the aforenoted conversion is named the u255 law.

Single integrated circuit chip codecs have become well-known which use the so-called charge-redistribution technique. While this technique will be described in some detail below, it is noted that a codec using this technique as well as a description thereof is available from Mostek Corporation as product type MK5150. The charge redistribution technique is also described in the report NON-LINEAR CONVERTERS FOR PULSE-CODE-MODULATING SYSTEMS by G. Smarandoiu, Electronics Research Laboratory, College of Engineering, University of California, Berkeley, Calif., dated May 24, 1978.

Figure 3:
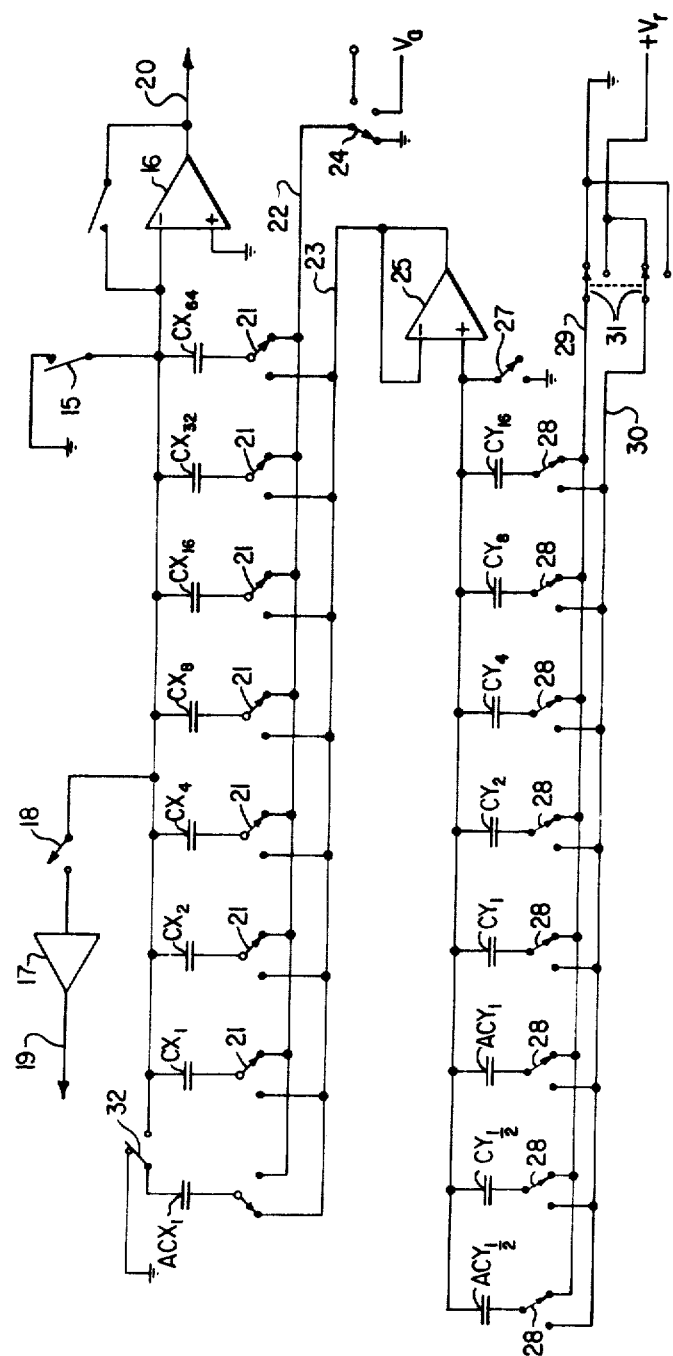
Figure 4:
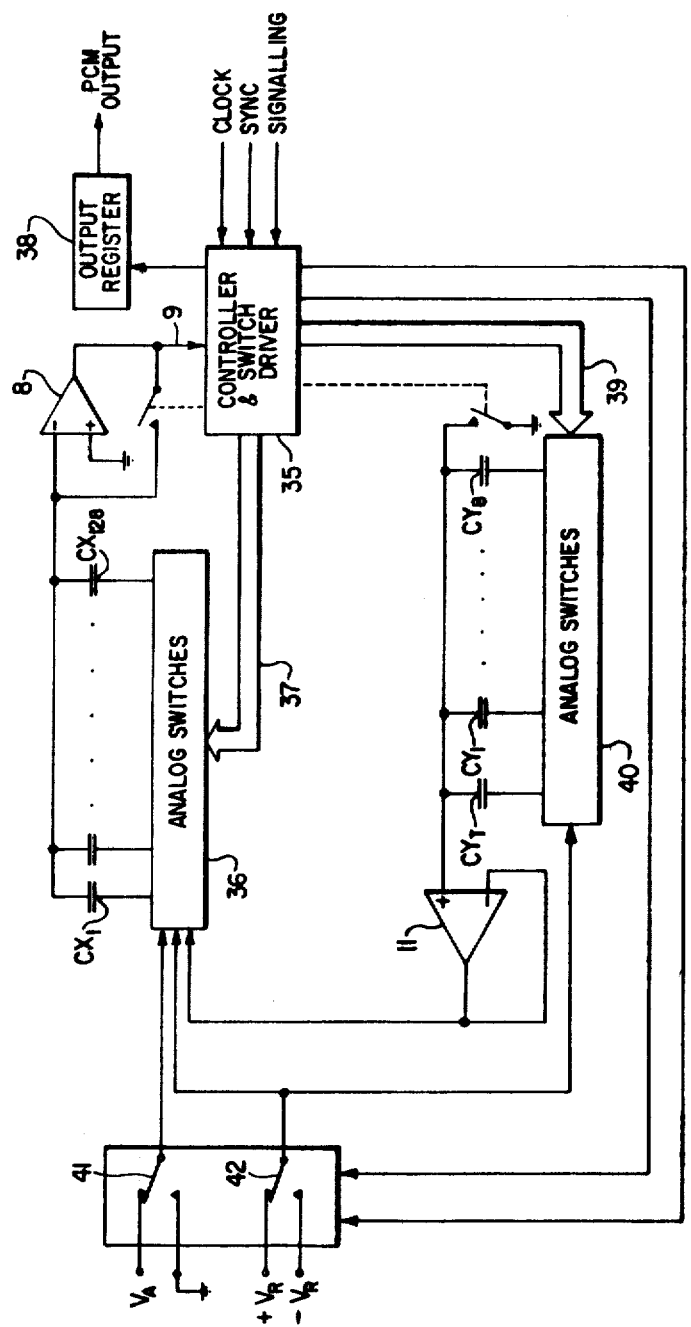
Figure 5:
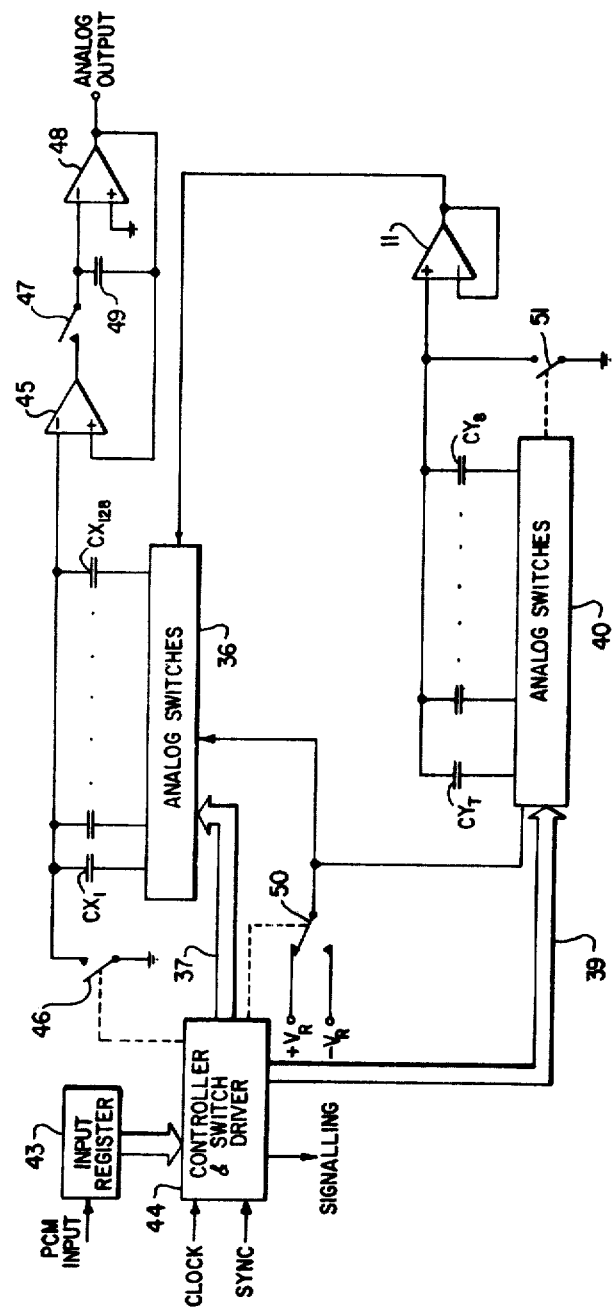
Figure 6:
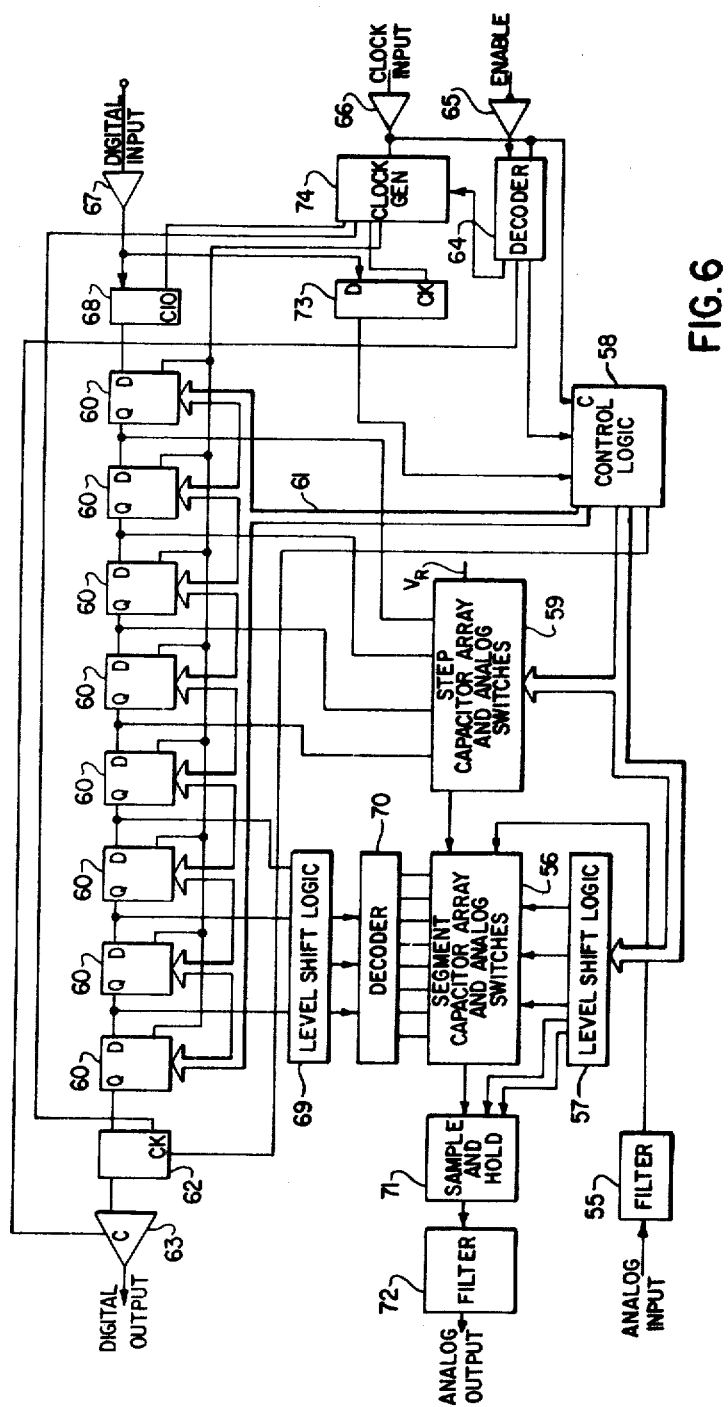

A better understanding of the prior art and of the structure of the present invention will be obtained by reference to the detailed description below, and to the following drawings, in which:

FIGS. 1A and 1B are transfer characteristics of a codec defined by the u255 law, FIG. 2 is a schematic diagram of a charge distributing circuit according to the prior art, FIG. 3 is a schematic diagram of a charge distributing circuit according to the present invention, FIGS. 4 and 5 are block diagrams of an encoder and a decoder respectively for using the prior art charge distributing circuit, and FIG. 6 is a block diagram of a codec system for using the charge distributing circuit according to the present invention.

Turning now to FIGS. 1A and 1B, the main features of analog-to-digital and digital-to-analog transfer characteristics respectively are shown in general. These curves are approximations, made up of linear sections, of ideal smooth exponential curves, and are implemented with eight positive and eight negative (relative to the origin) binary weighted segments 100, each of them, except the first being divided into 16 steps (only one group of steps, 101, being illustrated). Each segment has a length double that of the previous one, as described earlier. The last step in the digital-to-analog decoder segments is 1.5 times longer than the previous ones.

For analog-to-digital conversion, the analog input signal is represented along the abscissa $A_{in}$ in FIG. 1A, and the resulting ordinate position reflected by the approximate exponential curve including the step position within a segment which determines the digital encoding of the output signal $D_{out}$. As the system is clocked, a pulse code modulated output signal is generated and transmitted containing digital values representated by the segments and steps at sampled signal intervals of the input analog signal. Amplitude compression is achieved.

In the reverse direction, as shown in FIG. 1B, a digital signal represented along the abscissa $D_{in}$ of Fig. 1B is received, and after decoding of the segment and step position of each digital value an analog output signal, reflected on the $A_{out}$ ordinate by the transfer characteristic, is produced. Amplitude expansion is achieved.

In both figures, the steps 101 are shown for only one segment, but are representative of the steps in the segments of the entire curve.

FIG. 2 is a schematic diagram of a basic prior art codec circuit which uses charge distribution techniques. Each of the switches shown is only representative for schematic and explanatory purposes, but in actual realization is formed of MOS analog transmission gates in a manner known and obvious to those skilled in the art. Since codecs of this form are known, operation of only the encoding function will be described below, as an example from which the structure and advantages of the present invention can be distinguished.

A sample of an analog input signal voltage $V_a$ is applied to input terminal 1. Switch 2 passes the input signal to a first lead 3, to which one terminal of eight of the capacitors $CX_1$–$CX_{128}$ are connected via switches 4. At the same time the other terminal of each of capacitors $CX_1$–$CX_{128}$, all of which are connected together, are connected to ground through switch 5. The sample of the input signal is thus stored on all of the capacitors $CX_1$–$CX_{128}$. Switch 13 connected across comparator 8 is provided for offset nulling of the amplifier. Switch 5 is not connected to ground for offset nulling, but brings the common capacitor terminal close to the offset point, handling the heavy current which would otherwise have to be carried by operational amplifier 8.

Switches 2 and 5 then operate, transferring switch 2 and opening switch 5, connecting the switched terminals of the capacitors to ground, and rendering the commonly connected terminals more negative than ground for a positive value of $V_A$. The output of amplifier 8 determines the sign bit for the outgoing PCM word.

Switch 4 connected to capacitor $CX_1$ is now switched to a second lead 6, which is connected via switch 7 to a source of potential $+V_r$. The resulting circuit forms a capacitive divider connected between $+V_r$ through capacitor $CX_1$, and through the remaining capacitors $CX_2$–$CX_{128}$ in parallel, to ground. The junction of the divider, that is, the commonly connected terminal of all the capacitors is connected to the inverting input of comparator 8. The potential $+V_r$ is thus added to the stored input voltage sample.

Due to the charge redistribution between the capacitors, a voltage related to the sample of the input signal voltage is applied to the input of comparator 8. If this is sufficient to switch the amplifier, a change in output level is observed on output lead 9.

In the event no change in output level is obtained, switch 4 connected to capacitor $CX_2$ is operated, connecting it to second lead 6 in parallel with capacitor $CX_1$. Additional charge is redistributed between the capacitors, and the voltage level at the input of comparator 8 changes. In similar manner successive capacitors $CX_4$, $CX_8$, etc., are switched in parallel with capacitor $CX_1$, distributing the charge of the original input signal level until comparator 8 switches. It should be noted that as each capacitor is switched in parallel with capacitor $CX_1$, there is progression along the abscissa of FIG. 1A, and the input of comparator 8 is driven to segments successively distant from the origin. The relationship of the values of the capacitors is 2 to the power n, where n varies from 0 to 7 (creating 8 transfer characteristic segments).

A method of successive approximations may also be used. In this technique, a middle capacitor is switched first, followed by a capacitor on either side. This technique is faster than the one described above, since only 3 switching steps need be used, rather than 8 steps.

It should be noted that if the sample of the input signal is negative, switch 7 is caused to switch to the source $-V_r$, and as a result the operational amplifier 8 is driven to determine transfer characteristic segments which are negative of the origin in FIG. 1A.

Once the proper segment has been selected as evidenced by the switching or conduction of comparator 8, the position within a segment is determined by checking the individual steps. In this case the terminals of those CX capacitors connected to the $+V_r$ reference voltage are switched to a third lead 10, which is connected to the output of a buffer 11.

Capacitors CYT, $CY_1$, $CY_2$, $CY_4$ and $CY_8$ each have one of their terminals connected together and to the non-inverting input of buffer 11. The other terminal of capacitor $CY_1$ is switched via switch 12 to potential $+V_r$ (or $-V_r$), and is thereby connected in series with the CX capacitors connected between the input of comparator 8 and (previously) potential $+V_r$ (or $-V_r$). Again, charge is distributed, and since capacitor $CY_1$ is small, a first step in the opposite voltage direction at the input of operational amplifier 8 is taken. If comparator 8 does not switch (or cease conducting), capacitor $CY_2$ is switched its associated via switch 12 into parallel configuration with capacitor $CY_1$, and so on, until comparator 8 switches, changing its output potential. The values of the CY capacitors vary with a power of 2, where the power changes from 0 to 3, giving the potential of 16 individual voltage steps.

Once the appropriate position on the input axis of FIG. 1A, the abscissa, has been selected, the exact segment and step within the segment on the logarithmic curve has been determined. External logic circuits, having determined which capacitors are switched, can now generate the digital code for the digital output.

It should be noted that since the amplitude of each of the segments of the transfer characteristic curve is double that of the previous segment, the value of each of the CX capacitors is $2^n$ times a constant (since it is the ratio of the capacitor values rather than their absolute values which determines the curve shape), where n is the number of segments in the curve. Consequently for eight segments in the curve, the capacitor values are 1, 2, 4, 8, 16, 32, 64 and 128, times a constant.

Similarly the capacitors $CY_1$-$CY_8$ have a binary relationship, to obtain 16 steps. Since the CY capacitors are merely connected in parallel with each other, the resulting parallel circuit being in series with the $V_r$ voltage applied to the CX capacitors, various combinations of them are used in binary progression.

The above described codec has been fabricated on one or more integrated circuit chips. It has now been found that a charge redistribution form of codec can be prodided which utilizes considerably less integrated circuit chip area than the one just described.

Since capacitance is directly related to capacitor plate area, the area of capacitor $CX_{128}$ is about the same as all the other CX capacitors combined. Further, if the codec transfer characteristic were to increase by one or more additional segments, or digital bits, each additional capacitor required would increase the required chip area exponentially.

The power sources $+V_r$ and $-V_r$ in the prior art circuit must be accurately matched and track precisely in temperature variances. To facilitate the tracking, they have been placed close together and close to the remaining codec circuitry where they have been found to pick up noise and cause distortion.

It has now been found that the prior art requirement for both positive and negative sources $+V_r$ and $-V_r$ can be reduced to a single source, while the codec still retains the entire transfer characteristic, both negative and positive portions. Thus the costly and unsatisfactory power supply requirement of requiring two closely tracking supplies is eliminated, and facilitates easy provision of power derived from an analog line carrying unipolar direct current.

In general, the invention is a codec for translation of an input signal comprising a first plurality of capacitors having one terminal of each capacitor connected in common, a circuit for switching the common terminal of the capacitors to a first reference voltage, and a circuit for selectively switching the other terminal of each capacitor between a first lead and a second lead. A further circuit selectively switches the first lead between a source of the input signal, the first reference voltage and a high impedance. A second plurality of capacitors has one terminal of each capacitor connected in common. A buffer has its input connected to the common terminal of the second plurality of capacitors, and its output connected to the aforenoted second lead. A switching circuit switches input of the buffer to the first reference voltage and a further switching circuit selectively switches the other terminal of each of the second plurality of capacitors to a third or a fourth lead. An additional switching circuit switches the third and fourth leads interchangeably to the first reference voltage and a second reference voltage. Upon switching of sequences of the other terminal of capacitors of the first plurality of capacitors between the first and second leads, a distribution of charge is effected therebetween, and upon switch of sequences of the other terminal of capacitors of the second plurality of capacitors between the third and fourth leads a distribution of charge is effected therebetween. An output circuit carries an output signal from the aforenoted one terminal of the first plurality of capacitors resulting from the distribution of charge between the first capacitors and the distribution of charge between the second capacitors. With the first reference voltage at ground potential, only a single power source voltage is required.

According to a preferred embodiment the capacitance of each capacitor of the first plurality of capacitors is respectively C, C, 2C, 4C, 8C, 16C, 32C and 64C, where C is a constant, the first capacitor C being switchable to the common terminal of the remaining first plurality of capacitors, and the capacitance of each capacitor of the second plurality of capacitors is respectively (½)C, (½)C, C, C, 2C, 4C, 8C, and 16C, where C is a constant.

According to a further embodiment of the invention, the translation circuit also includes a circuit by which, for providing a digital output signal, capacitors of the first plurality of capacitors can be switched from the first lead to the second lead after application of an analog sample of an input signal until the comparator switches its state, and in which each capacitor of the second plurality of capacitors is progressively switched from the fourth lead to the third lead after switching first plurality of capacitors except the first capacitor C from the second lead to the high impedance, until the comparator again switches its state, the voltage level at which the comparator last switches state, being a larger amplitude decision level value, is equal to $$\pm V_r[-0.5/128 + (2^{(s-1)}/128 \times (17+n)/33)]$$

where $V_r$ is the second reference voltage s varies from 1 to 8 as the first plurality of capacitors is switched from the first to the second lead and n varies from 0 to 15 as the second plurality of capacitors is switched from the fourth to the third lead.

whereby the designations of the switched capacitors when the comparator last switches state determines an output PCM word corresponding to said analog sample.

According to a still further embodiment of the invention, the translation circuit also includes a circuit in which the input signal is a PCM word designative of particular capacitors to be switched. The capacitance of each capacitor of the first plurality of capacitors is respectively C, C, 2C, 4C, 8C, 16C, 32C, and 64C, one terminal of the first capacitor having capacitance C being switchable to the first terminal of the remaining ones of the first plurality of capacitors. The capacitance of each capacitor of the second plurality of capacitors is respectively (½)C, (½)C, C, C, 2C, 4C, 8C, and 16C, where C is a constant. The codec also includes means for switching capacitors of the first and second plurality of capacitors from the first to the second lead and from the third to the fourth lead respectively as designated by the PCM word. The output voltage level is equal to $$V_r[-0.5/128 + (2^{(s-1)}/128 \times (16.5+n)/33)]$$

where $V_r$ is the second reference voltage s is a number between 1 and 8 designating the most significant capacitor of the first plurality of capacitors switched from the first to the second lead and n is a number between from 0 to 15 designating the most significant capacitor of the second plurality of capacitors switched from the fourth to the third lead. The resulting voltage level can form a sample of an analog signal, sequences of samples being carried to a filter for smoothing into a continuous analog form.

It should be noted in the above summaries and statements of the invention and in the detailed description of the preferred embodiment below, that only one reference voltage $V_r$ is required, rather than 2 as in the prior art. Further, the prior art large capacitor having capacitance 128 times the constant C is eliminated and instead one capacitor is added of capacitance only 16 times the constant C. Since the chip area required for the capacitors is directly related to their capacitance, the reduction in chip area is substantial. The resulting cost reduction is significant.

Turning now to FIG. 3, a circuit diagram of the present invention is shown. This circuit provides a coding-decoding function using the charge distribution technique of the prior art, described earlier.

Considering the reduction in chip area first, the segment capacitor CX array does not include the large area segment capacitor $CX_{128}$ required in the prior art, which as noted earlier, is equal in area to all of the segment capacitors combined.

It has been found that capacitor $CX_{128}$ can be deleted if an extra capacitor with the value $CY_{16}$, i.e. 16 times a common constant, is added to the step capacitor array, as described below. The step array previously contained capacitors sufficient to boost the voltage of the segment capacitor array up to one complete segment, i.e. from 1 to 16 steps; the addition of capacitor $CY_{16}$ has the effect of boosting the segment voltage by a complete additional segment, i.e. from 16 to 32 steps, and with the remaining segment capacitors boost the voltage to levels from to 32 potential steps, encompassing two segments in total, rather than only one segment, as in the prior art. This transfer characteristic is provided which includes the complete u255 law curve. A description of this in more detail is given below, with certain modifications to the general principle.

Thus, the capacitor $CX_{128}$ having an area of 128 units is eliminated and is replaced by a capacitor having only 16 units, an eight-fold reduction in area, while the u255 law transfer characteristics are maintained.

In the present invention, a plurality of capacitors $CX_1-CX_{64}$ have one electrode connected together i.e. in common, that common terminal being connected via switch 15 to the inverting input of comparator 16. The subscript attached to the capacitor reference designates the capacitance value, multiplied by a common constant. Switch 15 also switches the jointly connected terminal of the capacitors to ground, as in the prior art circuit of FIG. 2.

Also connected to the joint common terminal of capacitors $CX_1-CX_{64}$ is a sample and hold amplifier 17, having its input connected thereto via switch 18, which is used for the decode cycle. The output 19 of sample and hold amplifier 17 is adapted for connection to a filter for providing the output analog signals, for digital input signals. The output 20 of comparator 16 provides the digital output switching signal, for analog input signals, and is used for the encode cycle.

The opposite terminal of each of the capacitors is connected to corresponding switches 21. Switches 21 are connected so as to selectively switch the latter capacitor terminals to either of first lead 22 or second lead 23. Lead 22 is connected to switch 24, which selectively connects lead 22 to ground, the source of input signal $V_a$, or to an open circuit. The ground terminal can be connected to a predetermined potential, if it is desired to offset the transfer characteristics.

Lead 23 is connected to the output of a buffer amplifier 25.

One terminal of each of capacitors ACY-CY₁₆ are connected together and to the input of buffer amplifier 25. The input is connected via switch 27 to ground.

The other terminal of each of capacitors ACY-CY₁₆ are connected through corresponding switches 28 selectively to third and fourth leads 29 and 30. Leads 29 and 30 are respectively connected through changeover switch 31 to ground and to a source of reference potential $+V_r$.

The general charge redistribution function of the circuit operates similarly to that described earlier with respect to the prior art, except for the negative portion of the transfer characteristic, as will be described later. However, the specific input signal translation is different from the prior art, and is based on the following transfer characteristic expressions.

For decoding, the analog output voltage is $$V_r[-0.5/128 + (2^{(s-1)}/128 \times (16.5+n)/33)] \quad (1)$$

The high decision level for encoding conforms to the expression $$V_r[-0.5/128 + (2^{(s-1)}/128 \times (17+n)/33)] \quad (2)$$

The bottom decision level for ecoding conforms to the following expression $$V_r[-0.5/128 + (2^{(s-1)}/128 > (16+n)/33)] \quad (3)$$

where s represents the segment number and varies from 1 to 8, and n represents the step number within a segment, and varies from 0 to 15.

These equations give a transfer characteristic equal to the u255 law and the present circuit is designed to operate according to these equations.

It will be noticed that additional capacitors ACY₁, and ACY½ have been added to the step group of capacitors of the prior art of FIG. 2 (capacitor CY½ functioning similar to CYT of FIG. 2). These capacitors are required to meet the two equations which exactly represent the u255 law. It should be noted that the decode switching levels are at ½ the amplitude difference between the adjacent encode decision levels, and in order to sense the level of the input signal at the required points, the additional capacitors have been added. However these capacitors are physically very small and utilize only a small amount of chip substrate area. Capacitor ACX₁, the same size as capacitor CX₁ has been added to the segment array to provide the offset of $(-0.5/128)V_r$. However its capacitor terminal which would otherwise be connected to the common junction of capacitors CX₁-CX₆₄ is instead switchable between that junction and ground via switch 32.

In operation for encoding, a sample of an analog input signal $V_a$ is applied to lead 22 via switch 24. Capacitors CX₁-CX₆₄ are charged to the voltage of the input signal, and the common terminal of the capacitors is grounded through switch 15 to complete the input circuit. Comparator 16 can now be autozeroed, using switch 26 connected between output 20 and its inverting input, switch 15 being open circuited.

The common terminal of capacitors CX₁-CX₆₄ is then open circuited from ground via switch 15, and lead 22 is switched to ground via switch 24. The potential $-V_a$ thus appears at the input to comparator 16. The output of comparator 16 indicates the sign bit of the outgoing PCM word. The sign bit should be used to control the state of change-over switch 31. Where the output sign of comparator 16 indicates that the input is $+V_a$, lead 29 should be connected to ground, and if the $V_a$ is negative, lead 29 should be connected to $V_r$. For the present example, it will be assumed that the analog input signal sample to be encoded is of negative polarity.

Switch 27 is now grounded, causing the CY capacitors to be charged to the appropriate $V_r$ potential or ground. If the input is assumed negative lead 29 should be connected to $V_r$. Accordingly the CY capacitors have their bottom plates more positive than their top plates, the terminals of which are connected together.

Switch 27 is opened, and switches CY₁₆ and ACY½ are switched via associated switches 28 to lead 30, which is connected to ground. Accordingly a capacitive divider is formed, between ground, through capacitors CY₁₆ and ACY½ (16.5 capacitive units), in series with the remaining CY capacitors connected in parallel, to potential source $V_r$. The common junction between the capacitors is connected to the input of buffer 25, and the resulting output voltage from buffer 25 is $\pm(16.5/33)V_r$. The assumption here, of course, is that the number of steps within the segment is zero at this point of operation.

The output of buffer 25 is now connected via lead 23 to the bottom terminal of capacitor ACX₁, with switch 32 grounding its upper terminal. The bottom terminals of capacitors CX₁-CX₆₄ are connected via switches 21 to lead 22, and via switch 24 to an open circuit terminal. Switch 15 grounds their common terminal. Switch 32 is then switched to the common terminal of capacitors CX₁-CX₆₄. Since the capacitance of ACX₁ is ½ capacitance unit, and the total capacitance of capacitors CX₁-CX₆₄ is 127, the resulting voltage division provides a signal at the junction of capacitors ACX1 and the common junction of the remaining CX capacitors of $-(0.5/128)V_r$. This is formed, of course, since the voltage retained by capacitor ACX₁ is $(16.5/33)V_r=(½)V_r$.

Switch 15 is open circuited, and switch 24 is connected to ground. Capacitor ACY½ is now switched in parallel with the remaining capacitors CY½−CY₈, providing the portion of the equation $\pm(16/33)V_r$ at the output of buffer 25. This voltage level is applied to the CX capacitors as follows. Capacitor CX₁ is switched in parallel with capacitor ACX₁, to lead 23. If comparator 16 does not change state, then capacitor CX₂ is switched via switch 21 to lead 23, additional increasing capacitance capacitors being switched to lead 23 until comparator 16 changes state. When the comparator changes state, then the transfer characteristic segment above the $V_a$ sample input is defined.

The total value of the CX capacitors switched to lead 23 is reduced by ½, by switching the most significant valued capacitor back to lead 22. The CY capacitors are then sequentially switched to lead 30 until comparator 16 again changes state.

The identification of those capacitors which have been switched at the point at which comparator 16 changes state the second time provides the values of a PCM word which is output by the controlling logic circuit.

For decoding, an input PCM word causes the logic circuit to switch the CX and CY capacitors into a voltage divider between $+V_r$ and ground so that a predetermined voltage level corresponding to the PCM word is carried via switch 18 and buffer 17 to output lead 19. Since each PCM word defines a sample of the resulting analog output signal, filtering of the analog samples should follow. The charge distribution to form the analog level is obtained by first charging capacitor $ACX_1$ to $\pm V_r/2$, which signal is then switched into the $CX_1-CX_{64}$ array, with the particular capacitors switched identified by the PCM code.

For completeness of description of contrasting systems which can use the above described prior art circuits, and the circuit which is the subject of the present invention, a person skilled in the art understanding the invention is referred to the following.

FIGS. 4 and 5 are block diagrams of ancillary circuitry used to drive the prior art circuit of FIG. 2 as an encoder (FIG. 4) and a decoder (FIG. 5).

Turning first to FIG. 4, a controller and switch driver 35 is connected to a plurality of analog switches 36, which correspond to switches 4 of FIG. 2. The controller and switch driver can be either a logic circuit or a microprocessor, and a block of analog switches 36 are comprised typically of MOS switches logically driven from controller and switch driver 35 via bus 37 and adecoder contained in the analog switch block. One terminal of each of capacitors $CX_1-CX_{128}$ is connected to the analog switches 36, as in FIG. 2. The other terminals of capacitors $CX_1-CX_{128}$ are connected together and to the inverting input of operational amplifier 8, which has its output lead 9 connected to controller and switch driver 35. An output of controller and switch driver 35 is connected to the input of an output register 38 which carries the pulse code modulated output signal on its PCM OUTPUT lead.

Controller and switch driver 35 is also connected via bus 39 to analog switches 40 (corresponding to switches 12 of FIG. 2), to which one terminal of capacitors CYT, $CY_1-CY_8$ are connected. The other terminals of the CYT, $CY_1-CY_8$ capacitors are all connected together to the non-inverting input of buffer 11. The output of buffer 11 is connected to an input of analog switches 36. An analog signal source $V_a$ and ground are connected via single pole double throw switch 41 to the input of analog switches 36, corresponding to source $V_a$ and ground being connected to switches 4 via switch 2 in FIG. 2. Sources of potential $+V_r$ and $-V_r$ are connected via switch 42 to analog switches 36 and 40 similar to their connection through switch 7 in FIG. 2. Switches 41 and 42 are operated by controller and switch driver 35. Clock, synchronization, and signalling inputs are also applied to controller and switch driver 35.

The operation of the circuit of FIG. 4 as an encoder is the same as described earlier with reference to FIG. 2; timing and operation of the described switches in FIG. 4 are provided by controller and switch driver logic circuit 35, and the PCM OUTPUT signal is obtained by derivation of PCM words designated by the logic which switches analog switches 36 when the comparator 8 changes its output state.

In the prior art decoder circuit of FIG. 5, a pulse code modulated signal input is applied to input register 43, which has its output applied to controller and switch driver 44, which also has clock and synchronization signals input thereto. Controller and switch driver 44 has its output bus 37 (as in FIG. 4) connected to the input of analog switches 36 which are connected to capacitors $CX_1-CX_{128}$ also similar to FIG. 4. The common terminal of capacitors $CX_1-CX_{128}$ is connected to operational amplifier 45, and through switch 46 (controlled by controller and switch driver 44), to ground. The output of operational amplifier 45 is connected via switch 47 to the inverting input of operational amplifier 48. The output of amplifier 48 is connected to the non-inverting input of amplifier 45, and also to the inverting input of amplifier 48 via capacitor 49. The circuit including amplifiers 45 and 48, switch 47 and capacitor 49 forms a sample and hold circuit. Switch 47 is of course operated by controller and switch driver 44.

Controller and switch driver 44 is connected to control analog switches 40 via bus 39, and analog switches 40 are connected to capacitors $CYT-CY_8$, similar to FIG. 4. The common terminal of the capacitors $CYT-CY_8$ is connected to the non-inverting input of buffer 11, which has its output connected to the input of analog switches 36.

Potential sources $+V_r$ and $-V_r$ are connected via switch 50, (controlled by controller and switch driver 44), to analog switches 36 and 40. Switch 51, connected from ground to the non-inverting input of buffer 11 is also operated by the controller and switch driver via a decoder in analog switches circuit 40.

In operation the PCM INPUT signal is applied via input register 43 to controller and switch driver 44. The encoded input signal causes operation of analog switches 36 and 40 designated by the controller and switch driver after decoding, which results in capacitors $CX_1-CX_{128}$ and $CYT-CY_8$ being connected so as to divide the voltage $\pm V_r$ to ground. The resulting charge distribution on these capacitors establishes a particular voltage level at the input of the sample and hold circuit for each input PCM word, which provides a stepped analog output signal at the output of operational amplifier 48.

Since one charge distributed voltage level is established for each PCM INPUT word, the sample and hold circuit referred-to above holds the voltage level on capacitor 49 until the next PCM sample level is produced, whereupon switch 47 is closed by controller and switch driver 44 to sample and output the next analog level. Since the analog output signal is constituted by a sequence of steps, further filtering is of course necessary.

FIG. 6 is a block diagram of a codec system in which the present circuit invention can be used.

An analog input signal is applied to the ANALOG INPUT lead, and is passed through filter 55. From the output of the filter the analog signal (i.e. carried by the $V_a$ lead of FIG. 2) is applied to the segment capacitor array and analog switch combination 56.

The capacitor array and analog switch combination 56 is controlled by level shift logic circuit 57, which itself is controlled by control logic 58. Control logic 58 can be a microprocessor or a dedicated logic circuit. Step capacitor array and analog switches 59 is also controlled by control logic 58, and is connected as described earlier to segment capacitor array and analog switches 56.

A successive approximation register comprised of the series connection of a plurality of flip flops 60 operates as a shift register, for storing a digital input and/or output signal. A reset lead, a data lead and input output and successive approximately clock leads shown as bus 61, connects this register to control logic 58. A further lead carries a sign bit to a flip flop 62. Once the comparator 16 (FIG. 3) has switched, indicating to control logic 58 that the proper segment and step has been reached, control logic 58 generates and applies a corresponding digital PCM signal to flip flops 60 via bus 61, resulting in a serial digital output signal applied to flip flop 62 as the flip flops 60 are clocked. The signal is further applied to the DIGITAL OUTPUT lead via tri-state gate 63. The control input C of tri-state gate 63 is connected to the output of decoder 64, which is enabled from buffer 65 having its input connected to an external enable source, e.g. from a switching system. Decoder 64 is also clocked from the output of buffer 66, the input of which is connected to a clock source. The clock input of control logic 58 is also connected to the output of buffer 66.

Control logic 58 operates the segment and step capacitor arrays and ancillary analog switches at times determined by the clock and enable inputs, and operating the register comprising flip flops 60 to apply a PCM digital output signal to the DIGITAL OUTPUT lead.

In operation as a decoder, PCM digital input words are applied via the DIGITAL INPUT lead, through buffer 67, to a half-bit flip flop 68. The output signal of flip flop 68 is applied to the input of the first flip flop 60 of the register, and is shifted along the successive flip flops 60. From the outputs of each of the flip flops the signals cause operation of particular ones of the segment and step capacitor arrays, through level shift logic 69 and decoder 70. The resulting analog output sample generated as described earlier is applied to sample and hold circuit 71 and then to filter 72, resulting in an analog output signal on the ANALOG OUTPUT lead. The sample and hold circuit 71 is of course controlled by the level shift logic 57, under control of control logic 58.

The clock signal for shifting the output signal is derived from the digital input signal at the output of buffer 67, which is applied to the data input of flip flop 73, the clock input signal thereto being obtained from an output of clock generator 74 which has its input connected to the output of buffer 66 (which carries the master clock input). The output of flip flop 73 is connected to control logic 58. One output signal of clock generator 74 is applied to the clock inputs of flip flops 60, which forms the shift clock lead. The clock input of ½ bit flip flop 68 is connected to one output of clock generator 74, and forms the digital input clock lead.

While the above-described system is one of possibly a number which can use the present invention, it should be noted that the benefits of the present invention are obtained by the requirement for only a single power supply reference voltage to ground, rather than two which must be closely tracked and maintained noise free as in the prior art, and also by the substantial reduction in integrated circuit chip area over the prior art obtained by elimination of the most significant capacitance capacitor in one capacitor group and replacing it with one 8 times smaller in capacitance (and area) in another capacitor group (with an accompanying change in operation of the circuit). As is well known, this achieves both a reduction in cost and increase in reliability of the circuit. In addition printed circuit board space is reduced as a result of the elimination of one of the two reference power supplies, further saving cost and allowing the further miniaturization of the codec.

Persons skilled in the art understanding this invention may now conceive of other embodiments or variations, using the principles of this invention. All are considered to be within the sphere and scope of this invention, as defined in the claims appended hereto.

The embodiments of the invention in which an exclusive property or privilege is claimed are defined as follows:

1. A charge redistribution circuit for translation of an input signal comprising:
    (a) a first plurality of capacitors, one terminal of each capacitor being connected together,
    (b) means for switching said one terminal to a first reference voltage,
    (c) means for selectively switching the other terminal of each capacitor between a first lead and a second lead,
    (d) means for selectively switching the first lead between a source of said input signal, said first reference voltage, and a high impedance,
    (e) a second plurality of capacitors, one terminal of each capacitor being connected together,
    (f) a buffer having its input connected to said one terminal of the second plurality of capacitors, and its output connected to said second lead,
    (g) means for switching the input of the buffer to said first reference voltage,
    (h) means for selectively switching the other terminal of each of the second plurality of capacitors to a third or a fourth lead,
    (i) means for switching the third and fourth leads interchangeably to the first reference voltage and to a second reference voltage having a single polarity with respect to said first reference voltage,
    whereby upon switching of sequences of said other terminal of capacitors of the first plurality of capacitors between the first and second leads, a distribution of charge is effected therebetween, and upon switching of sequences of said other terminal of capacitors of the second plurality of capacitors between the third and fourth leads a distribution of charge is effected therebetween, and
    (j) output means for carrying an output signal from said one terminal of the first plurality of capacitors, resulting from the distribution of charge between the first capacitors and the distribution of charge between the second capacitors.

2. A circuit as defined in claim 1, in which the output means is comprised of a comparator, having a first input connected to said one terminal of the first plurality of capacitors, and a second input connected to the first reference voltage, and means for providing an output signal having a level below or above predetermined levels at the output of the comparator for designating the sign of an encoded output signal.

3. A circuit as defined in claim 1, in which the output means is comprised of a sample and hold circuit having its input connected to said one terminal of the first plurality of capacitors for providing elements of an output signal at its output for conversion to an analog signal.

4. A circuit as defined in claim 1, in which the output means is comprised of a comparator, having a first input connected to said one terminal of the first plurality of capacitors, and a second input connected to the first reference voltage, means for providing an output signal having a level above or below predetermined levels at the output of the comparator, and a sample and hold circuit having its input connected in a circuit to said one terminal of the first plurality of capacitors for providing elements of an output signal at its output for conversion to an analog signal.

5. A circuit as defined in claim 2 or 4, in which said first and second inputs of the comparator are its inverting and noninverting inputs respectively, said first reference voltage is ground, and said second reference voltage is a positive voltage relative to ground having amplitude at least as high as the maximum amplitude of the input signal voltage.

6. A circuit as defined in claim 1, in which the capacitance of each capacitor of the first plurality of capacitors is respectively C, C, 2C, 4C, 8C, 16C, 32C and 64C, said one terminal of the first capacitor having capacitance C being switchable to said first terminal of the remaining ones of the first plurality of capacitors, and in which the capacitance of each capacitor of the second plurality of capacitors is respectively $\frac{1}{4}$C, $\frac{1}{2}$C, C, C, 2C, 4C, 8C, and 16C, where C is a constant.

7. A circuit as defined in claim 1, 2 or 4, in which the input signal is a segment of an analog signal the capacitance of each capacitor of the first plurality of capacitors is respectively C, C, 2C, 4C, 8C, 16C, 32C and 64C, said one terminal of the first capacitor having capacitance C being switchable to said first terminal of the remaining ones of the first plurality of capacitors, and in which the capacitance of each capacitor of the second plurality of capacitors is respectively $\frac{1}{4}$C, $\frac{1}{2}$C, C, C, 2C, 4C, 8C and 16C, where C is a constant and further including means for switching capacitors of the first plurality of capacitors from the first lead to the second lead after application of an analog sample of the input signal until the comparator switches its state, and of the second plurality of capacitors from the fourth lead to the third lead, after switching the first plurality of capacitors except said first capacitor C from the second lead to the high impedance, until the comparator again switches its state, the voltage level at which the comparator last switches state, being a larger amplitude decision level value, is equal to $$V_r[-0.5/128 + (2^{(s-1)})/128 \times (17+n)/33)]$$

where
$V_r$ is the second reference voltage
s varies from 1 to 8 as the first plurality of capacitors is switched from the first to the second lead and
n varies from 0 to 15 as the second plurality of capacitors is switched from the fourth to the third lead
whereby the designations of the switched capacitors when the comparator last switches state determines an output PCM word corresponding to said analog sample.

8. A circuit as defined in claim 1, 3 or 4, in which the input signal is a PCM word designative of particular capacitors to be switched, the capacitance of each capacitor of the first plurality of capacitors is respectively C, C, 2C, 4C, 8C, 16C, 32C and 64C, said one terminal of the first capacitor having capacitance C being switchable to said first terminal of the remaining ones of the first plurality of capacitors, and in which the capacitance of each capacitor of the second plurality of capacitors is respectively ($\frac{1}{4}$)C, ($\frac{1}{2}$)C, C, C, 2C, 4C, 8C and 16C, where C is a constant, and further including means for switching capacitors of the first and second plurality of capacitors from the first to the second lead and from the third to the fourth lead respectively as designated by the PCM word, the output voltage level being equal to $$V_r[-0.5/128 + (2^{(s-1)})/128 \times (16.5+n)/33)]$$

where $V_r$ is the second reference voltage
s is a number between 1 to 8 designating the most significant capacitor of the first plurality of capacitors switched from the first to the second lead and
n is a number between 0 to 15 designating the most significant capacitors of the second plurality of capacitors switched from the fourth to the third lead.

9. A method of encoding a sample of an input signal having an unknown amplitude which is lower than a predetermined maximum comprising:
(a) applying a sample of the input signal to one common terminal of a first plurality of capacitors connected in parallel and connecting the other common terminal to ground, whereby the capacitors are charged to the voltage of the sample of the input signal, the respective capacitance values of the first plurality of capacitors being C, C, 2C, 4C, 8C 16C, 32C and 64C, where C is a constant,
(b) connecting said one common terminal to ground while switching said other common terminal from ground to the input of a comparator, the other input terminal of the comparator being connected to ground,
(c) detecting the sign of the output signal of the comparator,
(d) connecting one common terminal of a second plurality of capacitors to ground,
(e) connecting the other common terminal of the second plurality of capacitors to one of ground in the event the sign of the output signal of the comparator is positive, or to a supply voltage at least as high as said predetermined maximum in the event the sign of the output signal of the comparator is negative, the respective capacitance values of the second plurality of capacitors being $\frac{1}{4}$C, $\frac{1}{2}$C, C, C, 2C, 4C, 8C and 16C, where C is said constant,
(f) switching said other terminal of a $\frac{1}{2}$C and a 16C capacitor to the other of the supply voltage or ground,
(g) switching said one terminal of a C capacitor of the first plurality of capacitors to ground and its other terminal the first common terminal of the second plurality of capacitors via the output of a buffer,
(h) switching said other terminals of the remaining ones of the first plurality of capacitors to a high impedance, and said one common terminal thereof to ground,
(i) switching said one terminal of the latter C capacitor to said one common terminal of the first plurality of terminals,
(j) reswitching said $\frac{1}{2}$C capacitor to the first of ground or the voltage supply,
(k) switching capacitors of the first plurality of capacitors in parallel with said latter C capacitor until the output signal of the comparator changes states,
(l) switching capacitor having the most significant capacitance from a connection in parallel with said latter C capacitor to a connection in parallel with the remaining first plurality of capacitors,
(m) switching capacitors of the second plurality of capacitors in parallel with said 16C capacitor of the second plurality of capacitors until the output signal of the comparator changes state,
whereby the binary value identity of the switched capacitors at the last change of state of the output signal of the comparator designates the digital identification of a PCM word corresponding to the amplitude of the sample of the input signal.

* * * * *